United States Patent
Bianca et al.

(10) Patent No.: US 6,202,853 B1
(45) Date of Patent: *Mar. 20, 2001

(54) SECONDARY PROCESSING FOR ELECTRICAL OR MECHANICAL COMPONENTS MOLDED TO CONTINUOUS CARRIER SUPPORTS

(75) Inventors: Giuseppe Bianca, Temecula; Robert M. Bogursky, Encinitas, both of CA (US)

(73) Assignee: AutoSplice Systems, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/318,534

(22) Filed: May 25, 1999

Related U.S. Application Data

(63) Continuation-in-part of application No. 08/794,993, filed on Feb. 5, 1997, now Pat. No. 5,938,996, which is a continuation-in-part of application No. 08/584,534, filed on Jan. 11, 1996, now Pat. No. 5,706,952.

(51) Int. Cl.[7] .............................. B29C 39/18; B65D 85/90
(52) U.S. Cl. ...................... 206/713; 264/252; 264/272.14
(58) Field of Search .................................. 206/701, 706, 206/709–717, 722–727; 264/145, 146, 252, 261, 263, 272.11, 272.14, 272.15, 274; 425/116

(56) References Cited

U.S. PATENT DOCUMENTS

| | | |
|---|---|---|
| 3,606,000 | 9/1971 | Wise . |
| 3,625,352 | 12/1971 | Perkins . |
| 3,672,046 | 6/1972 | Storey, II et al. . |
| 3,711,931 | 1/1973 | Ladouceur et al. . |
| 4,417,396 | 11/1983 | Ammon et al. . |
| 4,422,708 | 12/1983 | Birnholz . |
| 4,480,150 | 10/1984 | Jones et al. . |
| 4,785,527 | 11/1988 | Bernard et al. . |
| 4,793,060 | 12/1988 | Pretchel . |
| 4,812,421 | 3/1989 | Jung et al. . |
| 4,816,426 | 3/1989 | Bridges et al. . |
| 4,850,227 | * 7/1989 | Luettgen et al. .................... 29/621.1 |
| 4,857,483 | 8/1989 | Steffen et al. . |
| 4,901,854 | 2/1990 | Bone et al. . |
| 5,263,241 | 11/1993 | Hart, Jr. et al. . |
| 5,266,739 | 11/1993 | Yamauchi . |
| 5,286,426 | 2/1994 | Rano, Jr. et al. . |
| 5,303,821 | 4/1994 | Ayres . |
| 5,399,104 | * 3/1995 | Middlehurst et al. ................. 29/846 |

FOREIGN PATENT DOCUMENTS 0 333 395   9/1989   (EP) .

* cited by examiner

Primary Examiner—Jim Foster

(57) ABSTRACT

A new continuous carrier for surface mount or other electrical or mechanical parts, and a method of fabricating same, formed by molding one or a pair of continuous flexible film strips to a side or sides of a series of desired electrical or mechanical components such that the components are attached to the single strip or filament or suspended between the film strips or filaments. Following the initial molding step, the components, while still supported by the film strips or filament, are subjected to secondary processing Examples are: providing electrically-conductive coatings on the component throughout or selectively, providing electrically-conductive traces on the moldings, or molding in a second molding stage a part of a different composition or shape to the initial molded part. The film stips may be provided with sprocket holes or other equivalent structure for advancing the film strips during the molding process and for reeling up the result assembly onto a reel for sale or distribution to a PCB assembler.

17 Claims, 7 Drawing Sheets

SECONDARY PROCESSING FOR ELECTRICAL OR MECHANICAL COMPONENTS MOLDED TO CONTINUOUS CARRIER SUPPORTS

RELATED APPLICATION

This application is a continuation-in-part of U.S. application, Ser. No. 08/794,993, filed Feb. 5, 1997, U.S. Pat. No. 5,938,996, which is in turn a continuation-in-part of U.S. application, Ser. No. 08/584,534, filed Jan. 11, 1996, now U.S. Pat. No. 5,706,952.

The invention is directed to an improvement of the continuous carrier support concept for carrying electrical or mechanical components for automatic placement on a printed circuit board (PCB) or the like as described in related applications, Ser. No. 08/794,993 and Ser. No. 08/584,534, the contents of which related applications are hereby incorporated by reference.

BACKGROUND OF INVENTION

As described in the incorporated related applications, tape and reel supply of electrical parts for automatic pick-and-place by a mechanical or pneumatic device onto a PCB or similar device is well known in the art, but employed a series of pockets into each of which is placed a separately made electrical component. The assembly is then covered with a plastic strip and reeled up on a reel. During assembly of the PCB, the carrier tape is unreeled, the plastic strip removed, and a pick-and-place head is used to contact and pick a surface mount technology (SMT) component out of a carrier pocket and place it in a desired position, usually under control of a computer, on one or more tinned PCB pads.

The related applications described an improvement on this scheme by molding at least one continuous flexible film strip or filament to a side of each of a series of desired electrical or mechanical components such that the components are supported by the film strip or filament. The molded connection between each of the components and its supporting strip or filament is such that the components are ready separated from its supporting strip or filament in any one of several ways, such as by pushing, pulling or cutting, without damage to it or its neighboring components. Typically, the body of the electrical or mechanical component molded to the supporting strip or filament is of a moldable material, or at least has a part of moldable material that can be molded to the supporting strip or filament. Preferably, the body part of the electrical or mechanical component is molded to the supporting strip or filament by a semi-continuous injection molding process while a portion of the supporting strip or filament overlaps the mold cavities. The supporting strip or filament with the attached body parts can then be advanced to a fresh section and new body parts molded to it during a second molding cycle, and so on, to form a continuous strip of components supported on one or both sides by the continuous strip or filament.

Among the advantages of this scheme are a continuous strip of components that can be reeled up onto a reel for sale or distribution to a PCB assembler. The latter places the reel of molded parts onto a conventional feeding device which can use the sprocket holes or other equivalent structure on the supporting strip or filament for feeding the resultant carrier to, for example, an automatic pick-and-place machine. The parts can then be separated from the supporting strips, picked up by a conventional pick-and-place device in the machine and placed onto the PCB in the normal manner. A result is that the cost of fabricating packaged parts on a continuous carrier tape for automatic placement on PCBs is greatly reduced. In addition, the supporting strip or filament can be constituted of any material that can be attached to the moldable region of the component while the region is molded. The supporting strip or filament preferably is of a plastic that is different from the moldable region of the body. In addition, a die-casting process can be substituted for the plastic molding, since die-casting of low-melting point metals is in many ways similar to that of injection molding of plastics. The incorporated related applications also describe several ways of processing the resultant assembly following the molding step. In one embodiment, in the manufacture of pin headers, after the molding of plastic headers to the supporting strip or filament, the assembly is reeled up and supplied to a conventional insertion machine wherein metal pins can be inserted in pre-molded holes in the headers, and then the still-supported pin headers again reeled up for later sale or distribution. In another embodiment, after the molding step but before reeling up onto a reel pins can be inserted into the plastic bodies and caps placed over the pins to facilitate pick up by a pick-and-place device, and then the resultant product reeled up for later sale or distribution.

SUMMARY OF INVENTION

The present invention is a further improvement on the methods disclosed and claimed in the aforementioned incorporated related applications, and is based on the recognition that the electrical or mechanical components while still supported by the continuous strip or filament are readily subjected to further processing steps that are capable of modifying the surface properties, shape or composition of the electrical or mechanical components in a surprisingly economical process. This is a result of the ease of passing the individual components through various plating, paint molding or other processing stages also applicable to other continuous form manufacturing methods. In other words, electrical or mechanical components having a moldable region can easily at low cost be supported in continuous strip form in a primary processing step and while so supported readily subjected to secondary processing either before or after being reeled up onto a reel. Examples of secondary processes include but are not limited to: chemically plating a plastic component body with an electrically-conductive coating, either overall or selectively, to form a strip of electromagnetic interference (EMI) electrical shield covers for EMI shielding of electrical circuits; instead of chemically plating the plastic body, it can be metallized by painting with a conductive paint or by vapor depositing an adherent conductive layer on the body surface; applying conductive traces or circuits to the moldable body by any of the foregoing techniques to form part of a printed circuit; or running the electrical or mechanical components while on the supporting strip or filament through a second molding operation that would, for example, mold a second body of a different plastic or material to the first molded body.

As a result of employing the same primary processing as described in the incorporated related applications, the present invention will also provide the same benefits as are described in the latter applications. Moreover, it is applicable to the same kinds of materials, including but not limited to injection molded insulating plastic materials, such as ABS, PPA, polyesters, and polycarbonates as well as elastomeric materials, electrically conductive plastics, and low-melting-point metals such as zinc. Thus, the terms "molded", "injection-molded", "moldable", or "molding" as used herein should be understood in the broadest sense to include not only injection molding of plastics or other formable materials but also die casting of metals.

The various features of novelty which characterize the invention are pointed out with particularity in the claims annexed to and forming a part of this disclosure. For a better understanding of the invention, its operating advantages and specific objets attained by its use, reference should be had to the accompanying drawings and descriptive matter in which there are illustrated and described the preferred embodiments of the invention, like reference numerals or letters signifying the same or similar components.

SUMMARY OF THE DRAWINGS

In the drawings:

FIG. 7A is a perspective view of one of the PCBs during the processing of FIG. 7;

DETAILED DESCRIPTION OF PREFERRED EMBODIMENTS

For a better understanding of the present invention, attention is directed to the issued U.S. Pat. No. 5,706,952, which describes in detail how components, electrical or mechanical can be molded by way of a moldable region to the edges of one or two continuous strips or filaments which act as carriers for the strip of components for distribution or further processing. In the example given in FIG. 1 of the present application, which is derived from FIG. 9 of the patent, a strip of plastic 48 pre-stamped with sprocket holes is supplied from a reel 50 and advanced by any known indexing mechanism, for example, sprocket wheels and a synchronous drive (not shown), through a conventional stamping die stage 52 which configures and forms two side strips 28, 30.

Figure 1:
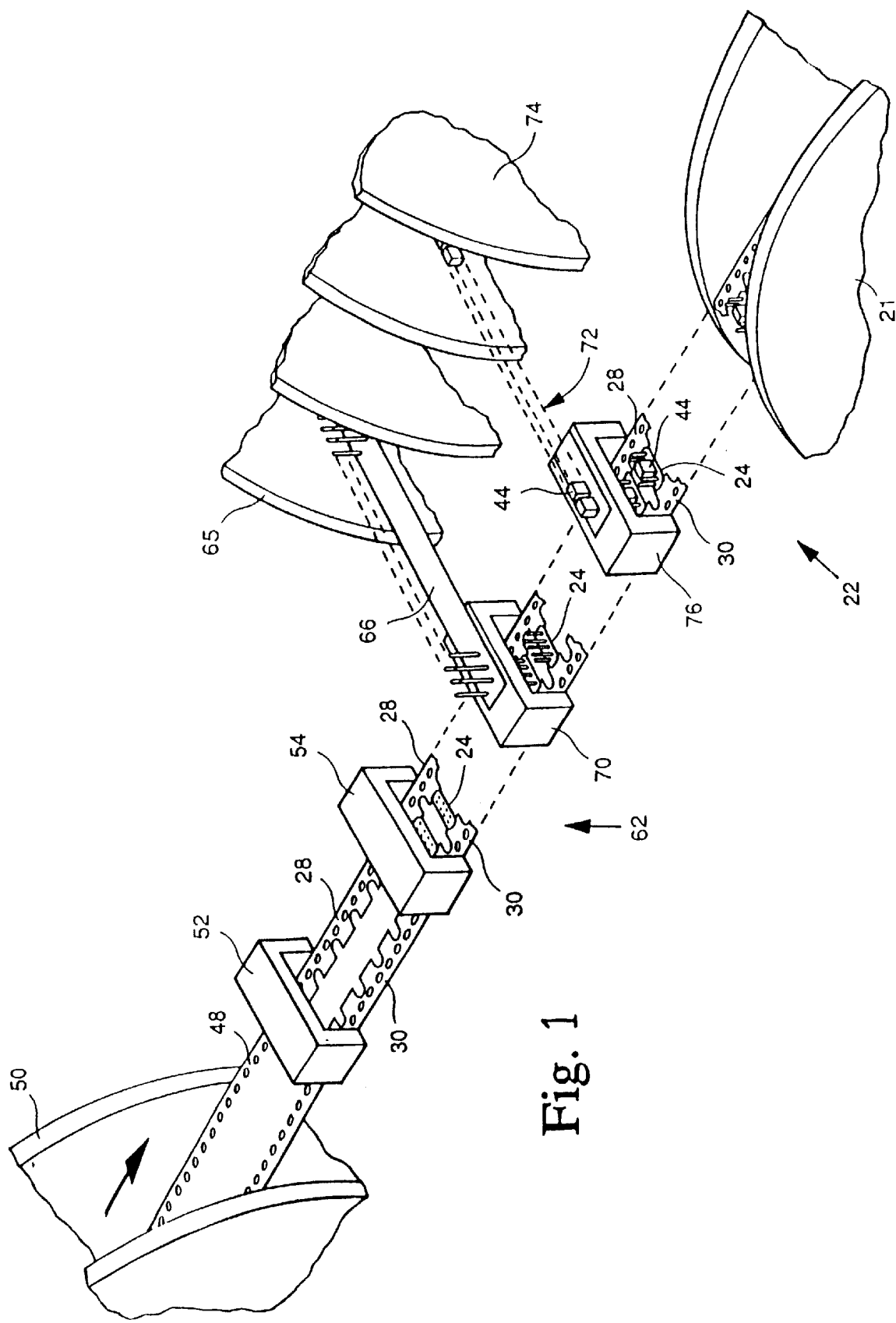
FIG. 1 is a schematic perspective view illustrating the fabrication of a continuous carrier in which the carrier-supported components are subject to one form of secondary processing in accordance with the invention.

While FIG. 1 shows a starting strip 48 with the same width as the final product, and with the stamper 52 removing the center strip section to form the two side strips 28, 30, this is not essential. One can start with two prestamped narrower strips or with a single narrower strip which is stamped or slit to form the two side strips 28, 30. The latter are then processed at stage 54 to encapsulate the strips 28, 30 into a series of molded components 24, header bodies in this example. Ways of doing this are illustrated in the patent. Briefly, the strips 28, 30 are indexed over a mold base or lower cavity of an injection mold, the upper cavity of which is a mirror image of the lower cavity. The lower cavity contains two mold sections, each configured to mold one of the header bodies. Each mold section contains along opposite edges recessed regions for receiving a strip. When the upper cavity part is closed over the lower cavity part the strips 28, 30 are clamped between the two mold parts. When molten plastic is injected into the closed mold in the usual way, the plastic body of each header is molded, simultaneously encapsulating the edge regions of both of the flexible strips. Apertures in the header body may be simultaneously molded by means of core pins in the mold halves, or they can be punched in a subsequent step. Following cooling, the mold halves are opened, and the finished assembly ejected from the mold, while simultaneously the assembly is advanced to provide in the opened mold the next strip sections to be encapsulated into the next set of headers to be molded. The process is repeated until molded headers have been attached to and suspended between the strips 28, 30 over their entire length.

In the schematic of FIG. 1, the processing stage 54 is in line in the multiple stage processing starting from one supply reel 50 and ending at one take-up reel 21. Pins can be supplied from a reel 65 as a continuous strip 66 with reduced thickness regions for separation of the pins in a conventional inserter machine 70, illustrated schematically in FIG. 1, which also inserts them into the apertures of the header bodies. If desired, a supply 72 of plastic caps 44 from a reel 74 is provided, individual caps 44 separated and attached to the headers 24 in a machine 76, and the modified assembly reeled up on a reel 21 typically with an interleaf layer for distribution or sale to the PCB fabricator.

Figure 2:
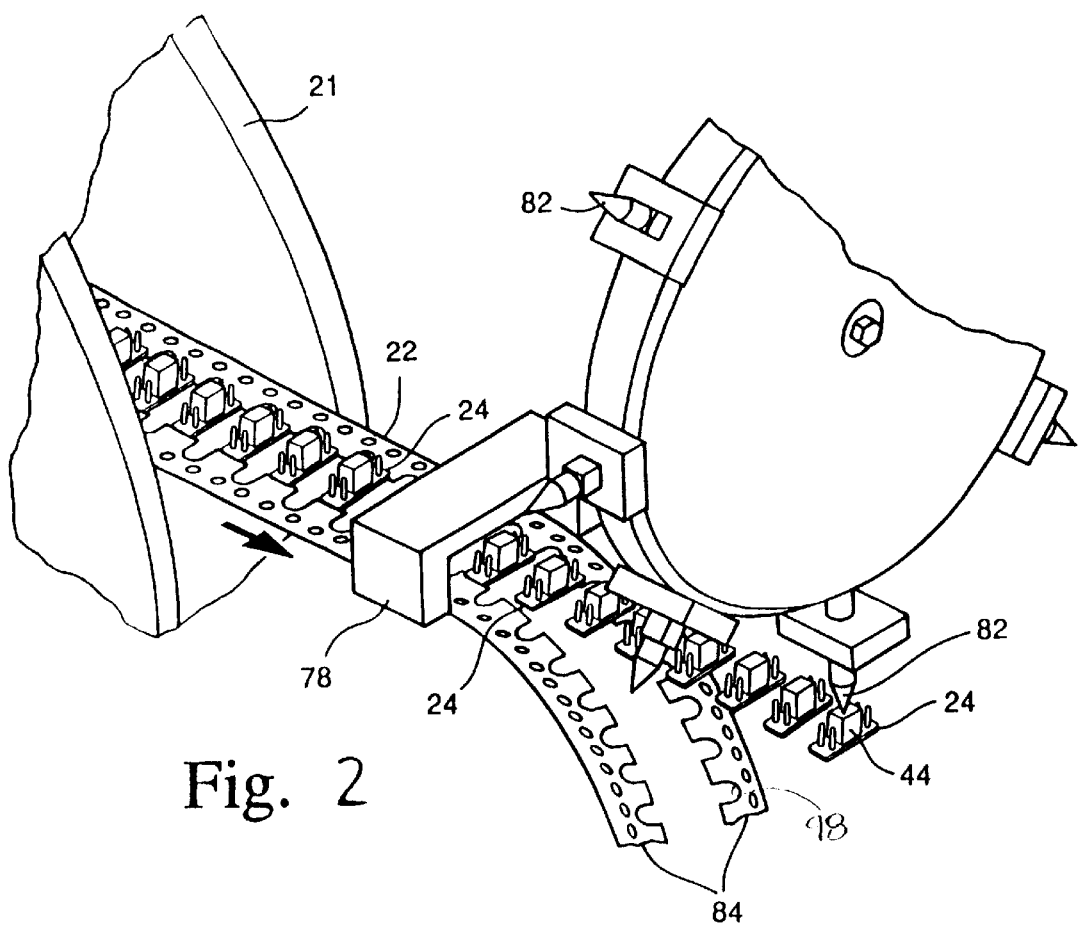
FIG. 2 is a schematic perspective view illustrating how individual components can be separated from the carrier of FIG. 1 and picked up by a conventional pick-and-place system.

At the plant of the fabricator (FIG. 2), the carrier 22 is unreeled from the reel 21 and passed through a device 78 which pushes up (by means not shown) on each of the supporting tabs of each of the strips 28, 30 with enough force, while the stips 28, 30 are tightly held, that the component 24 separates from its carrier strips 28, 30 and, while supported, the component can be picked up by a conventional pick-and-place device having a suction head 82 which contacts and vacuum-attaches to the component cover 44. As the carrier 22 advances, a suction head 82 comes into position with each newly-severed component 24 and carries it to the PCB, places the component, and then returns to pick up another component from the carrier 22. The carrier strip residues 84, together with the usual paper interleaf are guided to a separate accumulation area for waste disposal.

The amount of the overlap of the edge regions of the flexible strips 28, 30 with the mold sections, and thus the degree of encapsulation or attachment, controls the amount of pull-off force needed to separate each component 24 from its supporting strips. The pull-off force should be at least a minimum amount, to ensure that the electrical components 24 do not detach from their carrier during reeling and unreeling and normal handling before being deliberately separated at a time just before being picked-up by the pick-and-place device 82. Similarly, the pull-off force should not exceed a maximum amount, to ensure that any convenient separator force or separating device can be used to reliably separate a component from its carrier strips 28, 30 without causing damage to the separated component or the components that remain behind. Experience has shown that, for the component examples given above, a pull-off force of about 3–5 pounds per side is adequate to satisfy both requirements. This pull-off force is achieved by the example given in the patent. Smaller components may use a smaller overlap, and larger components can use a larger overlap. In this regard, it is useful to provide separating notches 98 in both strips 28, 30 between the component supports. The notches 98 act to weaken the strip at the region of the notches and thus isolate adjacent components and prevent separating forces applied to one component from being transmitted to and damaging adjacent components. Alternatively, the weakened strip regions can be supplied by a series of perforations.

The invention is obviously not limited to pin header components and can be applied to any type of electrical or mechanical component part that have moldable side regions that can be molded to the flexible strips. Examples of other components are SMT jumpers or switches with plastic housings, plastic headers with sockets, and various mechanical components with plastic body parts or with die-cast metal parts.

Preferably, the flexible strips 28, 30 are constituted of a high temperature plastic, such as polyesters commonly known as "Mylar". The high temperature property is desirable as the strip edges will be subjected to the elevated temperature of the injected molten plastic or metal used for molding the components and encapsulating the strips. A molding plastic should similarly be able to withstand the elevated temperatures of the standard SMT reflow or wave-soldering process that a PCB will be subject to. Molding plastics with this property are well known in the art and are available commercially from suppliers such as GE and DuPont. These and other plastics will be obvious to those skilled in this art.

While, in the preferred embodiment, the strips are provided with built in advancing means in the form of the sprocket holes, this is not essential. The downstream end of a strip can be attached to a take-up reel or other pulling device for advancing the strip or filament. Alternatively, the edges of the strip or filament can be engaged by friction drive means for advancing purposes.

Figure 3:
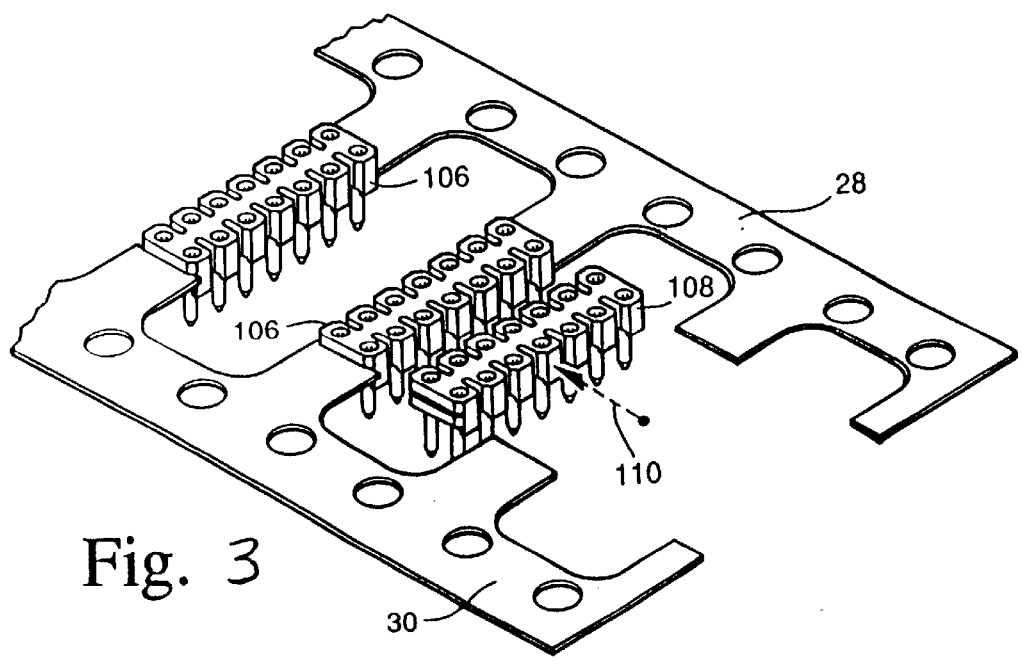
FIG. 3 is a perspective view of part of another series of strip-supported components, also showing another way of separating a component from the strips.

While pulling or pushing on the carrier to detach the component from the carrier is preferred, depending upon the component size and the strength of the carrier, the component can also be separated from its carrier supports by pulling or pushing on the component or by severing it from its carrier supports. In any case, no harm results if part of the carrier strip is left in place in the detached component and protrudes from the component side. FIG. 3 illustrates header assemblies 106 supported by carrier strips 28, 30, with the leading assembly 108 separated from the strips by a force 110 exerted in the longitudinal direction of the strips. As a Anther alternative, with shorter components but the same carrier width, it is possible to use tabs of the same length and with the molding extended from the component sides by thin tabs which are molded and attached to the strip tabs. In this case, cutting of the molded component tabs instead of the strip tabs would be preferred.

Figure 4:
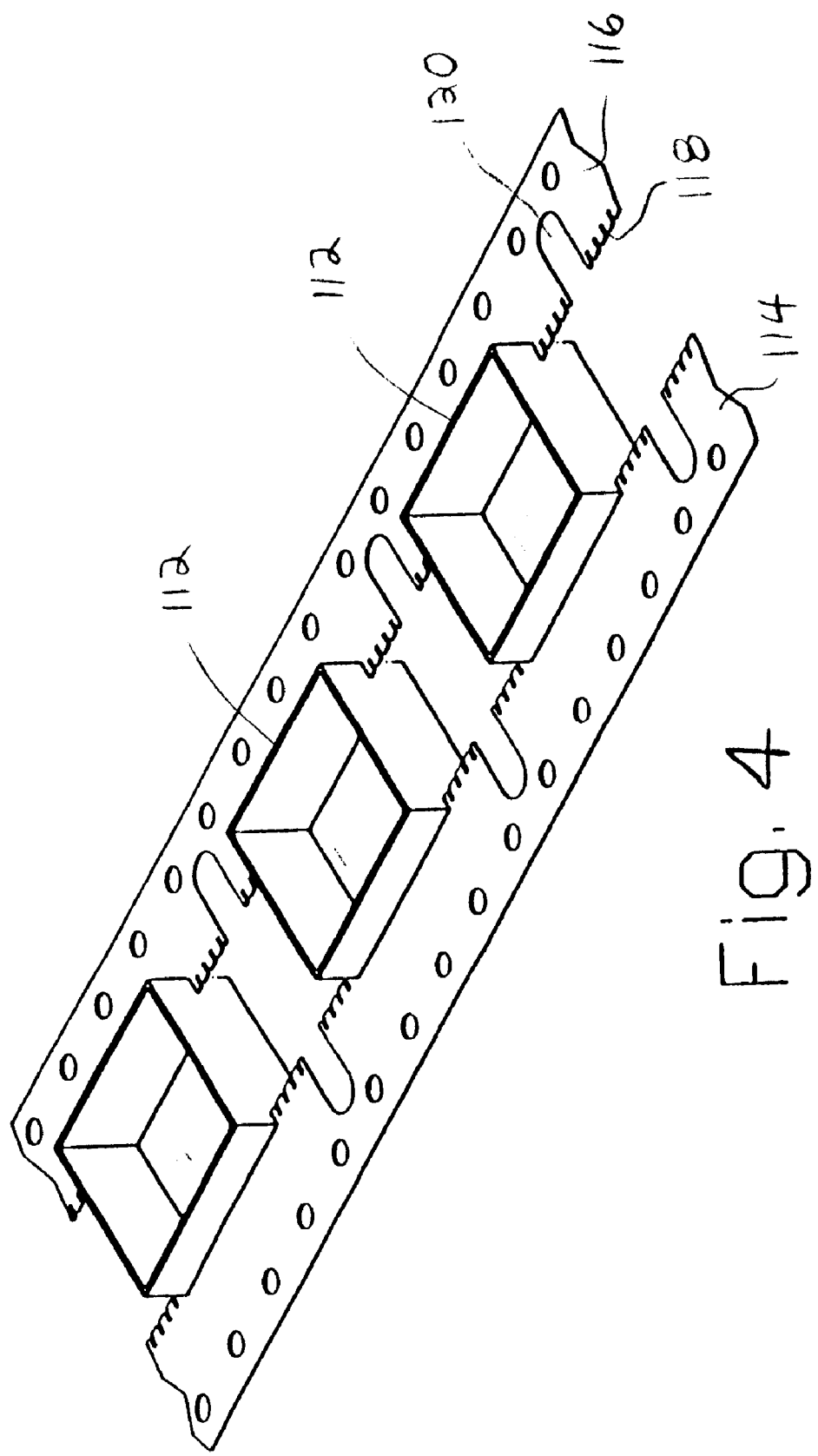
FIG. 4 is a perspective view of part of another series of strip-supported components useful, for example to form electrical shielding boxes, also showing one way of increasing the holding power of the strips.

FIG. 4 illustrates molding of a series of plastic boxes 112 with closed bottom and open top to a pair of carrier strips 114, 116 as described above. The strips have also been provided with means for enhancing the attachment to the boxes by adding holding structure to the strip edge. For example, as illustrated in FIG. 4, holes 118 can be punched into the strip edge region to be encapsulated. During the molding process, plastic or other moldable material fills the hole and reinforces the strength of the attachment of the component side to the carrier strip. The boxes are separated on the strips by notches 120 to simplify separation from the strips. The plastic boxes are non-conductive, and the object is to make the surfaces electrically-conductive so that the boxes can be used to cover and protect electrical components by shielding them from EMI. One form of secondary processing to achieve this result is illustrated in FIG. 5.

Figure 5:
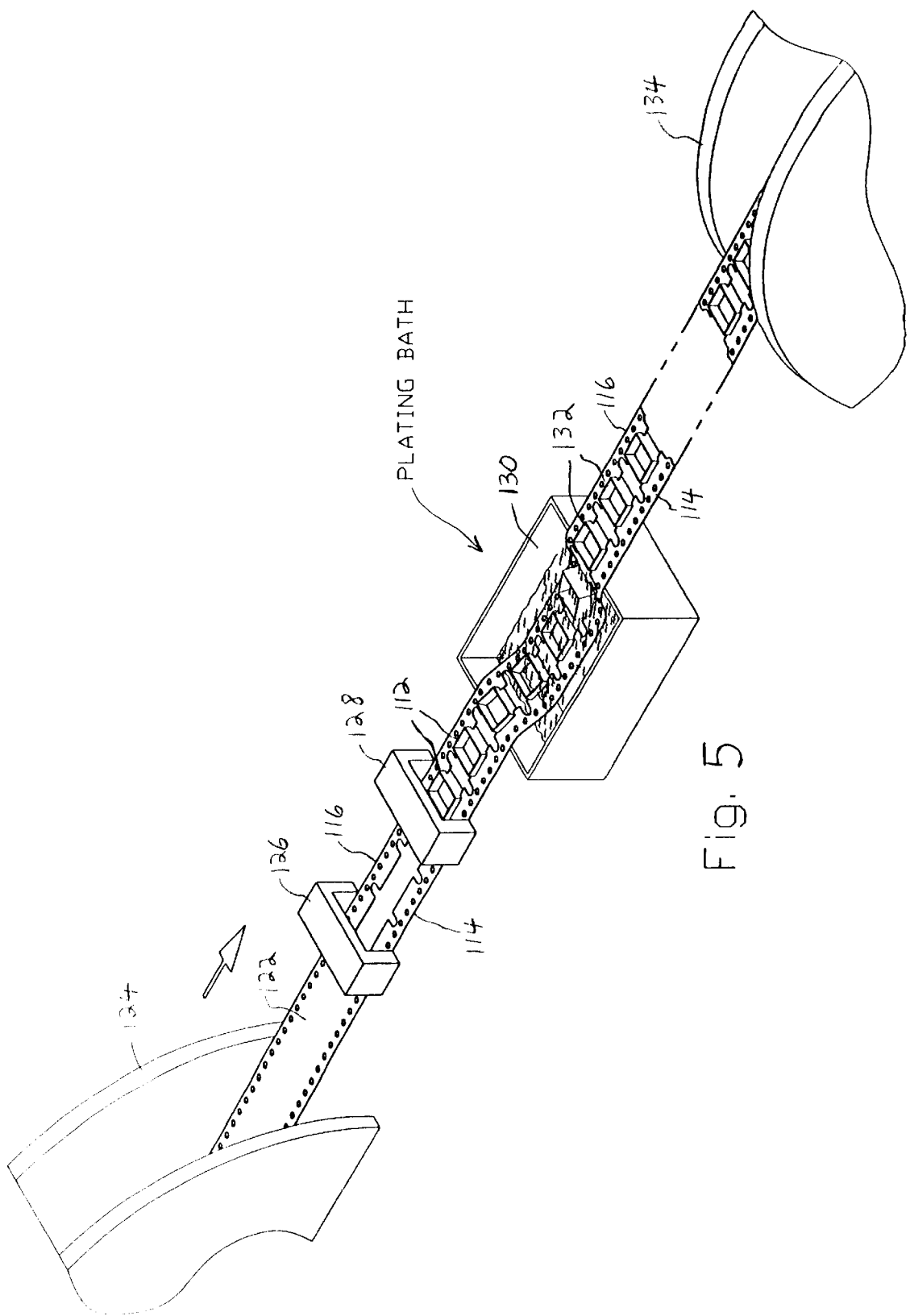
FIG. 5 is a perspective view schematically illustrating how the strip-supported components are subjected to secondary processing in the form of a plating bath.

In the FIG. 5 embodiment, a single strip 122 is unreeled from a supply reel 124, at stage 126 divided into spaced strips 114, 116, and at the next molding stage 128 boxes 112 are molded to the facing edges of the two strips. The carrier-supported boxes 112 are then passed through a secondary processing stage in the form of a known plating bath 130 that contains a plating solution that will plate the plastic surfaces of the boxes with an electrically-conductive coating, not shown in FIG. 5. The coated boxes 132, still supported by the carrier strips 114, 116, are then reeled up on take-up reel 134 for subsequent distribution or further processing. Subsequently, the boxes can be picked up on a pick-and-place machine and deposited on or over one or more electrical components to function as an EMI shield.

Figure 6:
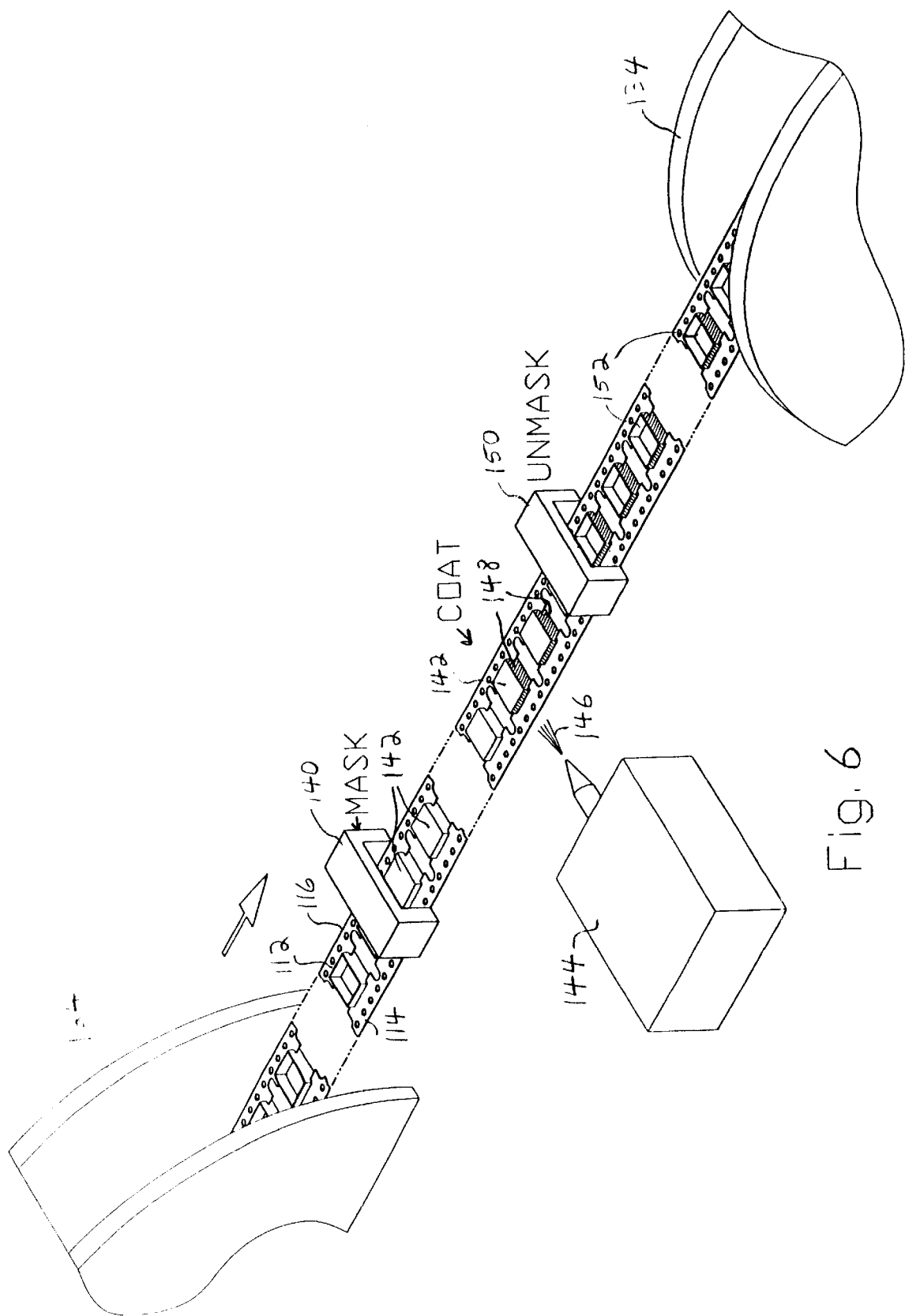
FIG. 6 is a perspective view schematically illustrating how the strip-supported components are subjected to another form of secondary processing in the form of masking, coating, and unmasking to selectively coat the shielding boxes of FIG. 4.

In the FIG. 5 process, the entire exposed box sauce is coated. There may arise situations wherein only parts of the surface of each box need to be coated. An example would be the presence of some electrical circuitry inside the box that could be short-circuited if the coating extended to the inside of the box. FIG. 6 illustrates a modified process for selectively coating the boxes or any other electrical or mechanical component. In this example, a supply reel 124 supplies a series of plastic boxes 112 suspended between carrier strips 114, 116. The boxes are conveyed by means of the carrier strips through a masking stage 140. Any way of temporarily closing off the tops of the boxes can be used to mask off the box interiors. FIG. 6 illustrates applying a rubber or plastic cap 142 over the open top of each of the boxes at stage 140. The masked boxes are then passed through a coating stage 144 which now sprays 146 an electrically-conductive coating 148 (shown by the hatching) onto the unmasked, exposed outer surfaces of the boxes. The masked interior surfaces remain free of the coating. The coating can be, for example, any conductive ink or silver paint that will adhere to the plastic. After drying (not shown), the selectively-coated boxes are passed through a further stage 150 that removes the temporary mask 142, and the resultant externally-coated boxes 152 reeled up on take-up reel 134.

Figure 7:
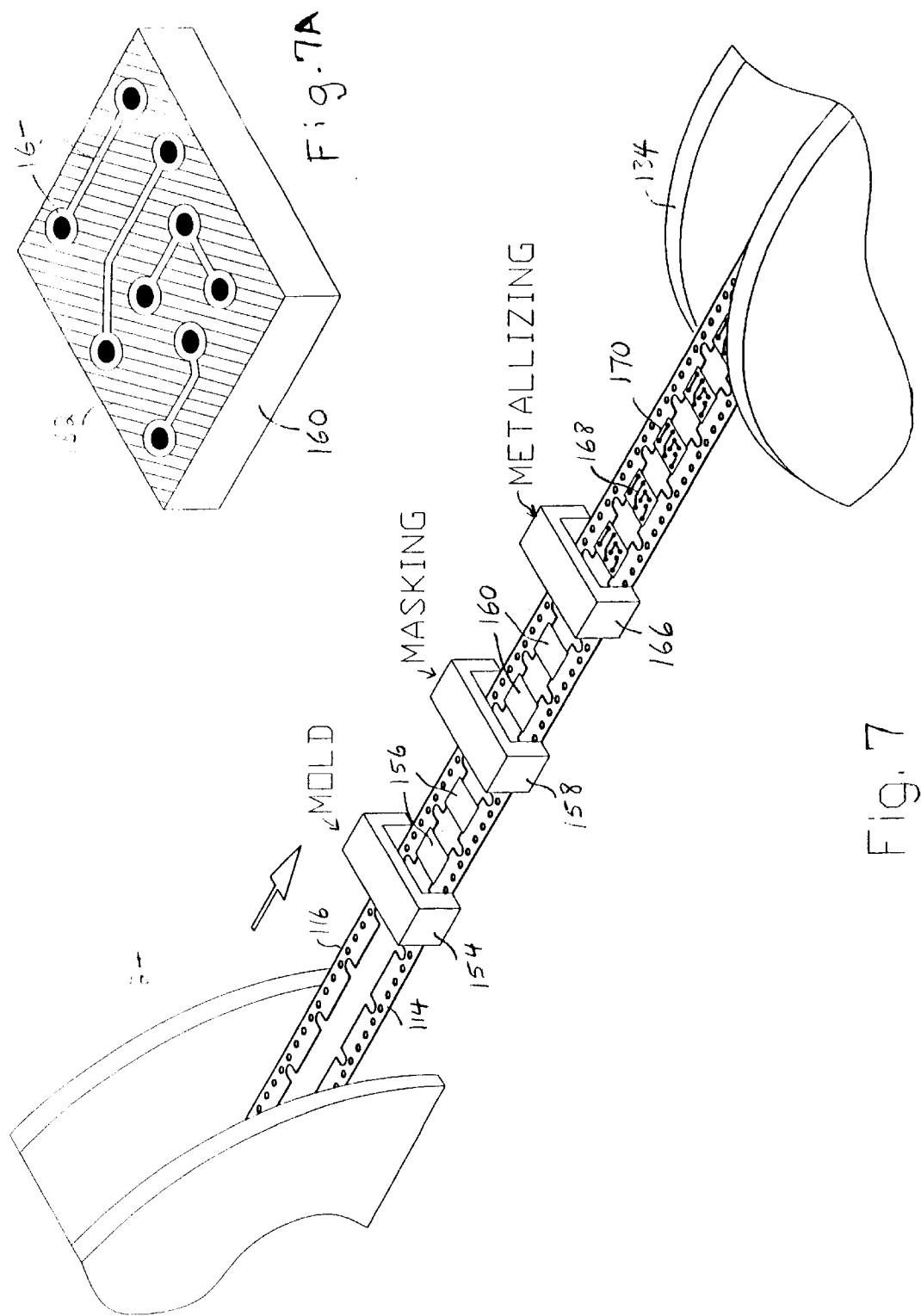
FIG. 7 is a perspective view schematically illustrating how the strip-supported components are subjected to still another form of secondary processing in the forming of small PCBs.

FIG. 7 shows a modified process for forming small PCBs. Carrier strips 114, 116 are supplied from supply reel 124 and, in a first molding stage 154, thin plastic discs 156 are molded to the opposed edges of the carrier strips. The carrier-supported discs 156 are then masked in masking stage 158 with a negative pattern to a desired printed circuit. There are many well-known ways of accomplishing this, including the photolithography techniques widely used in the IC field employing photosensitive resists. A particularly simple process is to use a photosensitive plastic for the discs 156. Such plastics are well-known and have become popular in the so-called 3D circuit molding process, photosensitive polyimide resins being one example. These plastics react to certain actinic light by adhering to applied metal coatings, but only where illuminated. Thus the masking stage 158 can consist of a simple optical stage which projects through a negative mask onto the surface of the plastic a pattern of the desired printed circut trace. FIG. 7A illustrates in an enlarged view disc 160 containing on its surface, shown by shading, the unilluminated surface areas 162 of the disc, with the illuminated areas 164 being represented by the solid lines. It is understand that this is schematic, since the illuminated areas, as well as the unilluminated areas, are actually invisible to the naked eye. The thus masked discs 160, still supported by the carrier strips 114, 116, are then passed through a known metaling stage 166 where metal is sprayed onto the masked surfaces of the discs. The metal 168 only adheres to the illuminated areas of the photosensitive plastic, so that the carrier-supported discs 170 when reeled up on take-up reel 134 will contain on its surface the desired electrically-conductive traces 168 needed to form part or all of the printed circuit. Many metals can be used in this process, copper being one example.

In the FIG. 6 embodiment, the secondary processing is carried out at the stages 140, 144, and 150. In the FIG. 7 embodiment, the secondary processing is carried out at the stages 158, and 166.

Figure 8:
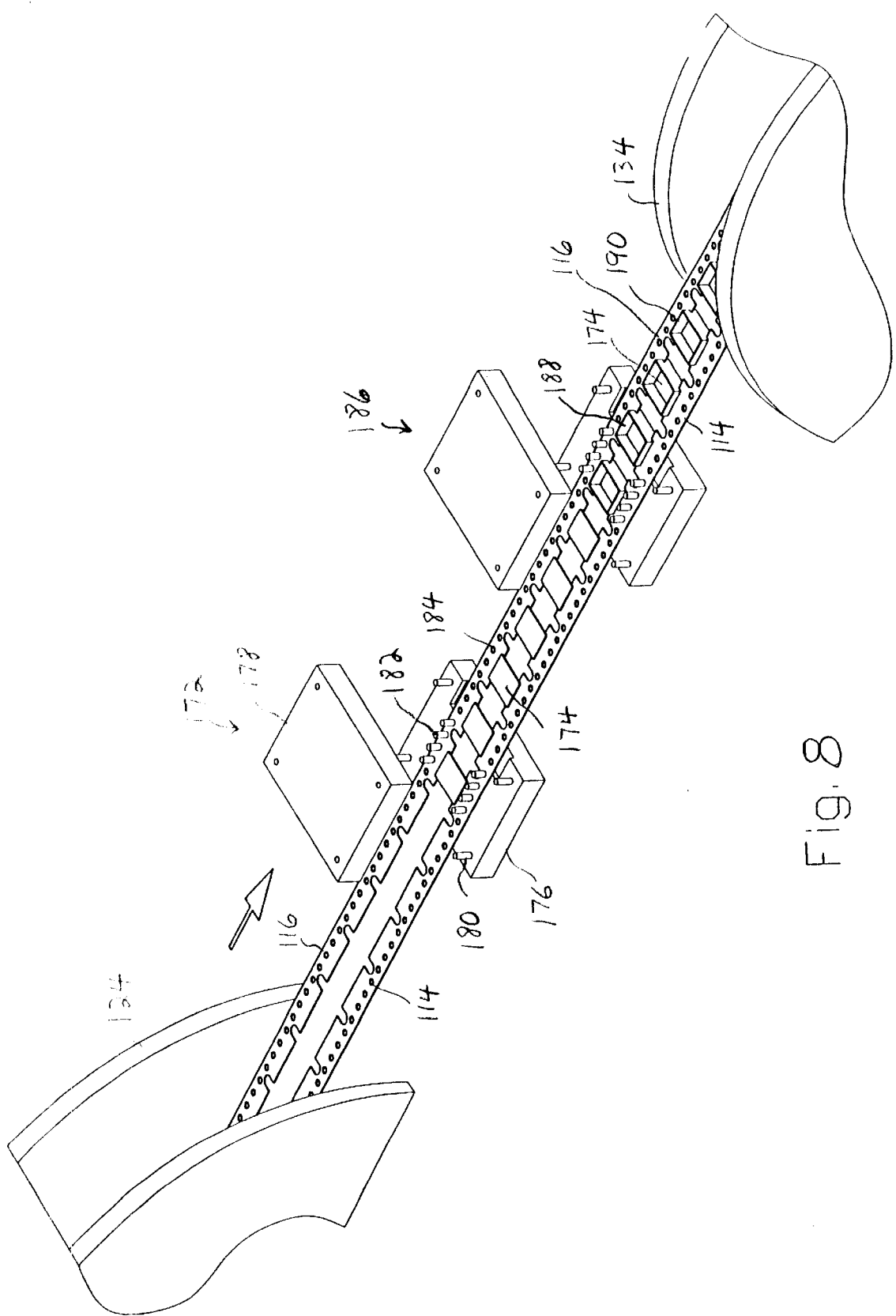
FIG. 8 is a perspective view schematically illustrating how the strip-supported components are subjected to still another form of secondary processing by molding in a second stage a different plastic to the plastic parts of the components molded to the carrier in an earlier stage.

In the next embodiment, the secondary processing is a second molding stage that molds to the electrical or mechanical components, molded to the carrier strips at a first molding stage, a second part that can be of a different composition. This is illustrated in FIG. 8, starting with carrier strips 114, 116 supplied by supply reel 124. At the first molding stage 172, plastic discs 174 are molded to the carrier strip. FIG. 8 also schematically illustrates mold halves 176, 178 which mold the discs to the overlapped strip edges. Pins 180 are used for alignment of the two mold halves. Pins 182 which engage the sprocket holes 184 are used to align the strips to the molds and maintain the pitch of the discs. The carrier-supported discs 174 are then passed through a second molding stage 186 similar to the first molding stage 172 wherein a rectangular frame 188 is molded to each of the discs 174. The two-piece, composite molded articles 190, still supported by the carrier strips 114, 116, are reeled up 134 for distribution or further processing. In the example given, assuming a printed circuit is going to be printed onto the disc base 174, it can consist of a photosenive plastic as previously described. Since the surrounding frame 188 will not have a printed circuit deposited, it can be made of a much cheaper plastic than that used for the disc base 174. This secondary process thus allows an article of a plastic of a different composition to be fused and molded to an article previously molded to the strips. The second article can be molded either to the first article and/or also to the carrier strips. Another example is the fabrication of plastic buttons that light up when depressed. In this instance, the base could be of a cheap opaque plastic to house, say, an LED, and the second article would be a more expensive transparent plastic through which the LED can be viewed when lit. Other examples would be evident to those skilled in this art.

A number of examples have been given of suitable plastics and electrically-conductive coating compositions, as well as of different kinds of well-known processes for applying electrically-conductive coatings or traces to plastic surfaces. Other examples for metallizing in whole or selectively plastics can be found in the following US patents, whose contents are herein incorporated by reference: U.S. Pat. No. 3,731,354; 4,112,190; 4,165,394; 4,374,868; 4,990, 363; and 5,749,744. These are not intended to be limiting as others will be evident to those skilled in the art.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A continuous carrier strip of electrical or mechanical components, comprising:
   a) two, continuous, laterally-spaced flexible filaments or flexible strips having a longitudinal direction,
   b) a series of spaced electrical or mechanical components each having at least one moldable side edge molded to and detachably attached to and suspended from and between a facing side region of each of the filaments or a facing side edge region of the flexible strips to form a continuous carrier strip containing a plurality of longitudinally-spaced components, the spaced electrical or mechanical components suspended between the facing side region of the filament or the facing side edge region of the flexible strip being the sole connection between the laterally-spaced flexible filaments or strips after molding thereto, the molded connection between the moldable side edge of the components and the facing side region of the filament or the facing side edge region of the flexible strip being such that individual components will remain attached to the filament or strip during normal handling of the filament- or strip-supported components but the components can be separated from the filament or strip by an applied separating force without damaging adjacent components,
   c) a second material or part being applied and adhered to at least a surface portion of the components while attached to and suspended from the filament or strip.

2. A continuous carrier strip according to claim 1, wherein the surface portion is of plastic, and the second material is an electrically-conductive surface layer.

3. A continuous carrier strip according to claim 2, wherein the second material comprises an electrically-conductive metal.

4. A continuous carrier strip according to claim 1, wherein the surface portion is of plastic, and the second material is part of a second component molded to the surface portion.

5. A reel and wound up on the reel a continuous carrier strip according to claim 1.

6. A method of fabricating a continuous carrier strip of electrical or mechanical components, comprising:
   a) providing at least one, continuous, flexible filament or flexible strip,
   b) providing at a first stage a mold with sections for the components, said mold having along a side a region for receiving the flexible filament or strip such that their edge overlaps an edge of the mold sections,
   c) clamping by the mold portions of the flexible filament or strip such that a side region overlaps an edge of the mold sections,
   d) injecting a moldable material into the mold to form at least part of the components molded to and encapsulating an edge region of the flexible filament or strip,
   e) removing the molded components with encapsulated filament or strip from the mold and advancing the flexible filament or strip until next following portions of the moldable filament or strip are in position to be clamped to the mold,
   f) while still attached to the filament or strip, at a separate second stage downstream from the first stage, applying to a surface portion of the components a second material or part, g) repeating steps c), d), e) and f) at least once to form a series of spaced components with applied second material or part molded along a side to and detachably attached to an edge region of the flexible filament or strip to form a continuous carrier strip containing a plurality of the components, h) the molded connection between the moldable edge of the components and the attached region of the filament or edge region of the flexible strip being such that individual components will remain attached to the filament or strip during normal handling of the filament- or strip-supported components but the components can be separated from the filament or strip by an applied separating action without damaging adjacent components.

7. A method of fabricating a continuous carrier strip of electrical or mechanical components as claimed in claim 6, wherein the molded component comprises plastic, and the second material is an electrically-conductive surface layer.

8. A method of fabricating a continuous carrier strip of electrical or mechanical components as claimed in claim 6, wherein the second stage is a metal coating or metallizing stage.

9. A method of fabricating a continuous carrier strip of electrical or mechanical components as claimed in claim 6, further comprising the step of reeling up the filament- or strip-supported components.

10. A method of fabricating a continuous carrier strip of electrical or mechanical components, comprising:

a) providing a pair of spaced, parallel continuous, flexible strips having along at least one edge structure for advancing the strips, b) providing a mold with sections for electrical components, said mold having along opposite sides regions for receiving the flexible strips such that their inside facing edges overlap opposite edges of the mold sections, c) clamping by the mold portions of the flexible spaced strips such that inside edge regions overlap opposite edges of the mold sections, d) injecting plastic into the mold to form at least part of the electrical or mechanical components molded to and encapsulating the edge regions of the spaced strips, e) removing the molded components with encapsulated strips from the mold and advancing the flexible strips until next following portions of the moldable strips are in position to be clamped to the mold, f) while still attached to the filament or strip, at a separate second stage downstream from the first stage, applying to a surface portion of the components a second material or part, g) repeating steps c), d), e) and f) at least once to form a series of spaced components with applied second material or part molded along a side to and detachably suspended between inside facing edge regions of the flexible strips to form a continuous carrier strip containing a plurality of the electrical or mechanical components, h) the molded connection between the moldable edges of the electrical or mechanical components and the facing edge regions of the flexible strips being such that individual electrical or mechanical components will remain attached to the strips during normal handling of the strip-supported components but the components can be separated from the strips by an applied separating force.

11. A method of fabricating a continuous carrier strip of electrical or mechanical components as claimed in claim 10, further comprising the step of reeling up the filament- or strip-supported components.

12. A continuous carrier strip of electrical or mechanical components, comprising:

a) at least one, continuous, flexible filament or flexible strip having a longitudinal direction, b) a series of electrical or mechanical components each having at least one moldable edge molded to and detachably attached to a region of the filament or an edge region of the flexible strip to form a continuous carrier strip containing a plurality of longitudinally-spaced components, the molded connection between the moldable edge of the components and the region of the filament or edge region of the flexible strip being such that individual components will remain attached to the filament or strip during normal handling of the filament- or strip-supported components but the components can be separated from the filament or strip by an applied separating force without damaging adjacent components.

c) a second material or part being applied and adhered to at least a surface portion of the components while still attached to the filament or strip, d) the surface portion being of plastic, and the second material being part of a second component molded to the surface portion, the second component molded to the surface portion comprising a plastic different from that of the surface portion.

13. A continuous carrier strip as claimed in claim 12, wherein the second component also has a different shape from that of the surface portion.

14. A method of fabricating a continuous carrier strip of electrical or mechanical components, comprising:

a) providing at least one, continuous, flexible filament or flexible strip, b) providing at a first stage a mold with sections for the components, said mold having along a side a region for receiving the flexible filament or strip such that their edge overlaps an edge of the mold sections, c) clamping with the mold portions of the flexible filament or strip such that a side region overlaps an edge of the mold sections, d) injecting a moldable material into the mold to form at least part of the components molded to and encapsulating an edge region of the flexible filament or strip, e) removing the molded components with encapsulated filament or strip from the mold and advancing the flexible filament or strip until next following portions of the moldable filament or strip are in position to be clamped to the mold, f) while still attached to the filament or strip, at a separate second stage downstream from the first stage, applying to a surface portion of the components a second material or part, g) repeating steps c), d), e) and f) at least once to form a series of spaced components with applied second material or part molded along a side to and detachably attached to an edge region of the flexible filament or strip to form a continuous carrier strip containing a plurality of the components, h) the molded connection between the moldable edge of the components and the attached region of the filament or edge region of the flexible strip being such that individual components will remain attached to the filament or strip during normal handling of the filament- or strip-supported components but the components can be separated from the filament or strip by an applied separating action without damaging adjacent components, i) the molded component being of plastic, and the second material being of a different plastic material.

15. A method of fabricating a continuous carrier strip of electrical or mechanical components, comprising:

a) providing at least one, continuous, flexible filament or flexible strip, b) providing at a first stage a mold with sections for the components, said mold having along a side a region for receiving the flexible filament or strip such that their edge overlaps an edge of the mold sections, c) clamping with the mold portions of the flexible filament or strip such that a side region overlaps an edge of the mold sections, d) injecting a moldable material into the mold to form at least part of the components molded to and encapsulating an edge region of the flexible filament or strip, e) removing the molded components with encapsulated filament or strip from the mold and advancing the flexible filament or strip until next following portions of the moldable filament or strip are in position to be clamped to the mold, f) while still attached to the filament or strip, at a separate second stage downstream from the first stage, applying to a surface portion of the components a second material or part, g) repeating steps c), d), e) and f) at least once to form a series of spaced components with applied second material or part molded along a side to and detachably attached to an edge region of the flexible filament or strip to form a continuous carrier strip containing a plurality of the components, h) the molded connection between the moldable edge of the components and the attached region of the filament or edge region of the flexible strip being such that individual components will remain attached to the filament or strip during normal handling of the filament- or strip-supported components but the components can be separated from the filament or strip by an applied separating action without damaging adjacent components, i) the second stage comprising a plating stage.

16. A method of fabricating a continuous carrier strip of electrical or mechanical components, comprising:

a) providing at least one, continuous, flexible filament or flexible strip, b) providing at a first stage a mold with sections for the components, said mold having along a side a region for receiving the flexible filament or strip such that their edge overlaps an edge of the mold sections, c) clamping with the mold portions of the flexible filament or strip such that a side region overlaps an edge of the mold sections, d) injecting a moldable material into the mold to form at least part of the components molded to and encapsulating an edge region of the flexible filament or strip, e) removing the molded components with encapsulated filament or strip from the mold and advancing the flexible filament or strip until next following portions of the moldable filament or strip are in position to be clamped to the mold, f) while still attached to the filament or strip, at a separate second stage downstream from the first stage, applying to a surface portion of the components a second material or part, g) repeating steps c), d), e) and f) at least once to form a series of spaced components with applied second material or part molded along a side to and detachably attached to an edge region of the flexible filament or strip to form a continuous carrier strip containing a plurality of the components, h) the molded connection between the moldable edge of the components and the attached region of the filament or edge region of the flexible strip being such that individual components will remain attached to the filament or strip during normal handling of the filament- or strip-supported components but the components can be separated from the filament or strip by an applied separating action without damaging adjacent components, i) the second stage comprising a masking or unmasking stage.

17. A method of fabricating a continuous carrier strip of electrical or mechanical components, comprising:

a) providing at least one, continuous, flexible filament or flexible strip, b) providing at a first stage a mold with sections for the components, said mold having along a side a region for receiving the flexible filament or strip such that their edge overlaps an edge of the mold sections, c) clamping with the mold portions of the flexible filament or strip such that a side region overlaps an edge of the mold sections, d) injecting a moldable material into the mold to form at least part of the components molded to and encapsulating an edge region of the flexible filament or strip, e) removing the molded components with encapsulated filament or strip from the mold and advancing the flexible filament or strip until next following portions of the moldable filament or strip are in position to be clamped to the mold, f) while still attached to the filament or strip, at a separate second stage downstream from the first stage, applying to a surface portion of the components a second material or part, g) repeating steps c), d), e) and f) at least once to form a series of spaced components with applied second material or part molded along a side to and detachably attached to an edge region of the flexible filament or strip to form a continuous carrier strip containing a plurality of the components, h) the molded connection between the moldable edge of the components and the attached region of the filament or edge region of the flexible strip being such that individual components will remain attached to the filament or strip during normal handling of the filament- or strip-supported components but the components can be separated from the filament or strip by an applied separating action without damaging adjacent components, i) the second stage comprising a molding stage.

* * * * *